(12) United States Patent
Cheng et al.

(10) Patent No.: US 10,134,595 B2
(45) Date of Patent: Nov. 20, 2018

(54) HIGH ASPECT RATIO GATES

(71) Applicant: International Business Machines Corporation, Armonk, NY (US)

(72) Inventors: Kangguo Cheng, Schenectady, NY (US); Sivananda K. Kanakasabapathy, Niskayuna, NY (US); Peng Xu, Guilderland, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/474,585

(22) Filed: Mar. 30, 2017

(65) Prior Publication Data

US 2018/0005834 A1 Jan. 4, 2018

Related U.S. Application Data

(62) Division of application No. 15/196,299, filed on Jun. 29, 2016.

(51) Int. Cl.
| | |
|---|---|
| *H01L 21/28* | (2006.01) |
| *H01L 29/423* | (2006.01) |
| *H01L 21/8234* | (2006.01) |
| *H01L 21/762* | (2006.01) |
| *H01L 29/51* | (2006.01) |
| *H01L 29/78* | (2006.01) |

(52) U.S. Cl.
CPC .. *H01L 21/28114* (2013.01); *H01L 21/28123* (2013.01); *H01L 21/76224* (2013.01); *H01L 21/823481* (2013.01); *H01L 21/823487* (2013.01); *H01L 29/4238* (2013.01); *H01L 29/42356* (2013.01); *H01L 29/42376* (2013.01); *H01L 29/518* (2013.01); *H01L 29/7827* (2013.01)

(58) Field of Classification Search
CPC .............. H01L 27/2454; H01L 29/7825
See application file for complete search history.

(56) References Cited

U.S. PATENT DOCUMENTS 7,915,659 B2 * 3/2011 Juengling ......... H01L 29/66545
257/308

OTHER PUBLICATIONS

Cheng et al., "High Aspect Ratio Gates," U.S. Appl. No. 15/196,299, filed Jun. 29, 2016.
List of IBM Patents or Patent Applications Treated as Related; Date Filed: Mar. 30, 2017, 2 pages.

* cited by examiner

*Primary Examiner* — Moazzam Hossain
*Assistant Examiner* — Farun Lu
(74) *Attorney, Agent, or Firm* — Cantor Colburn LLP; Vazken Alexanian

(57) ABSTRACT

Embodiments are directed to a method of forming a feature of a semiconductor device. In one or more embodiments, the feature is a gate, and the method includes forming a substrate and forming a gate material extending over a major surface of the substrate. The method further includes forming a trench extending through the gate material and into the substrate in a first direction, wherein the trench further extends through the gate material and the substrate in a second direction. The method further includes filling the trench with a fill material and forming individual gates from the gate material, wherein the individual gates extend along a third direction.

7 Claims, 9 Drawing Sheets

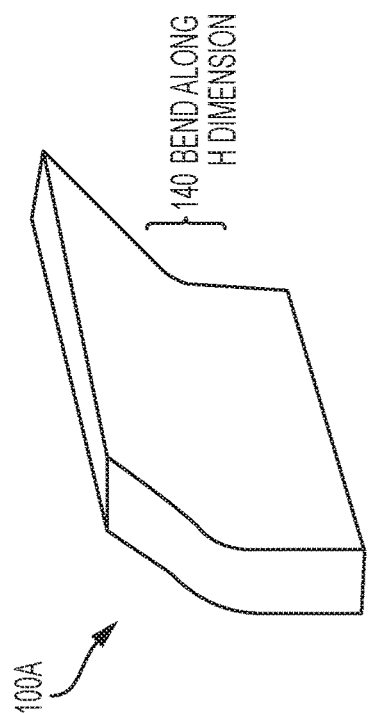
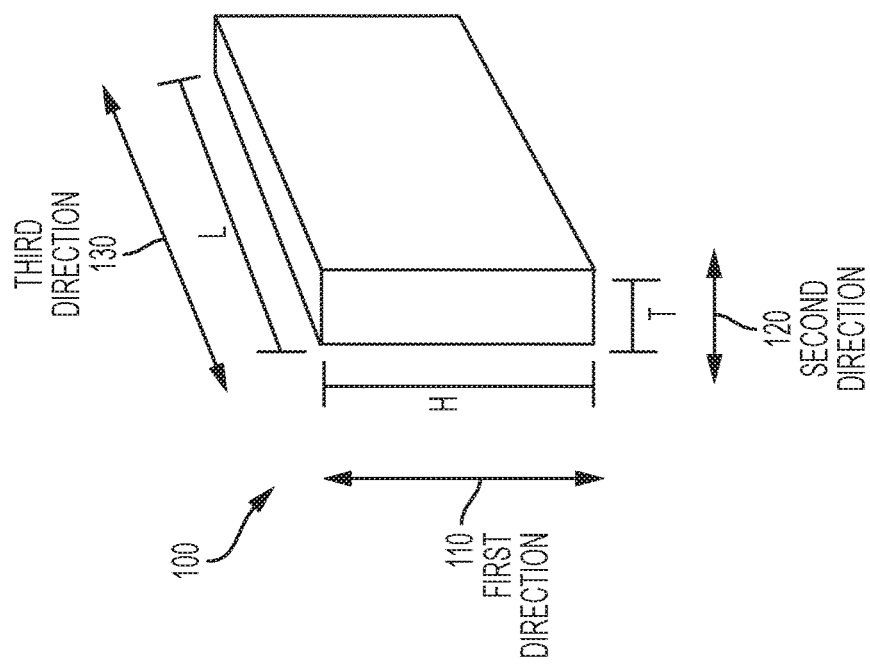
FIG. 1B
FIG. 1A

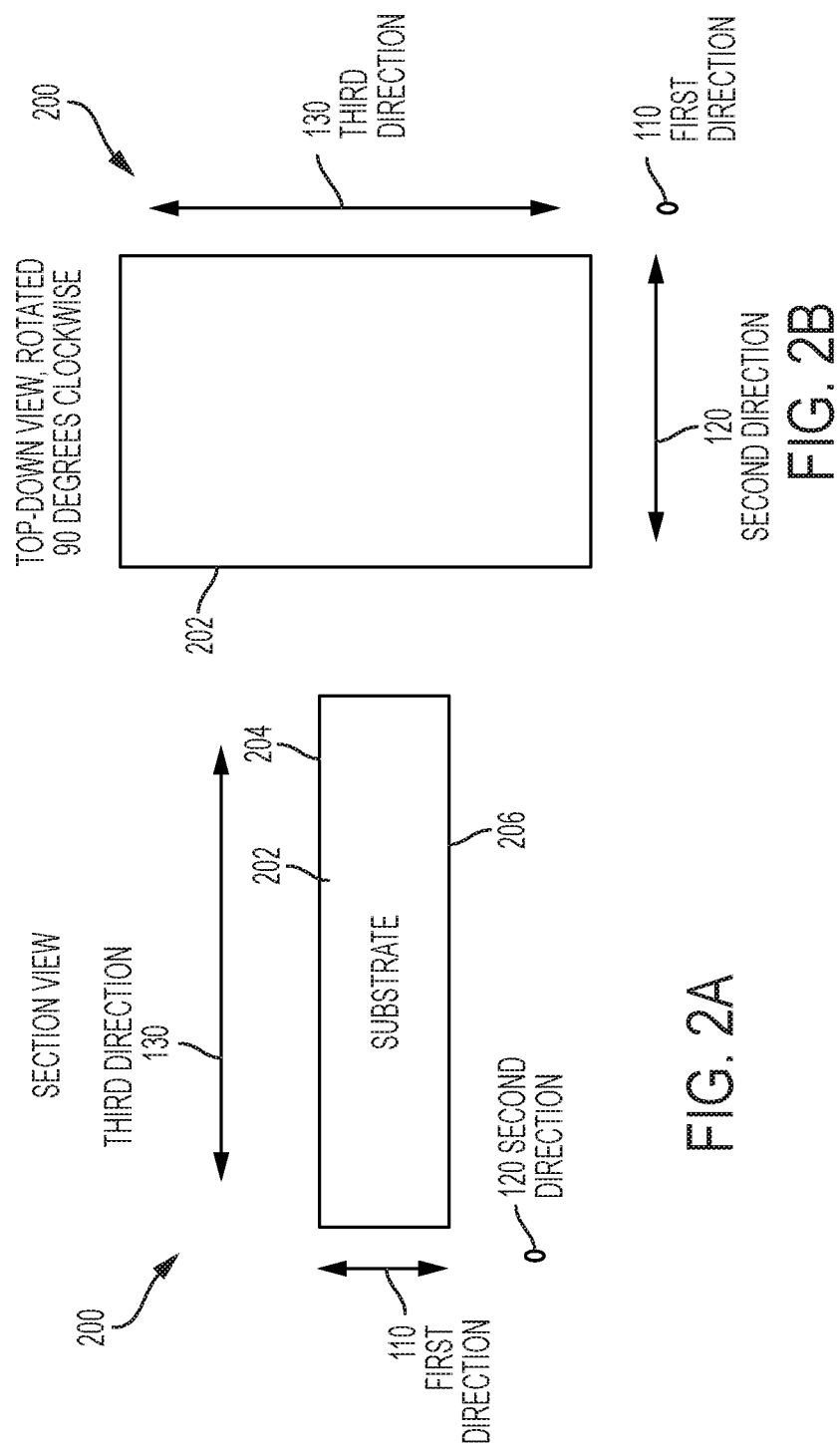

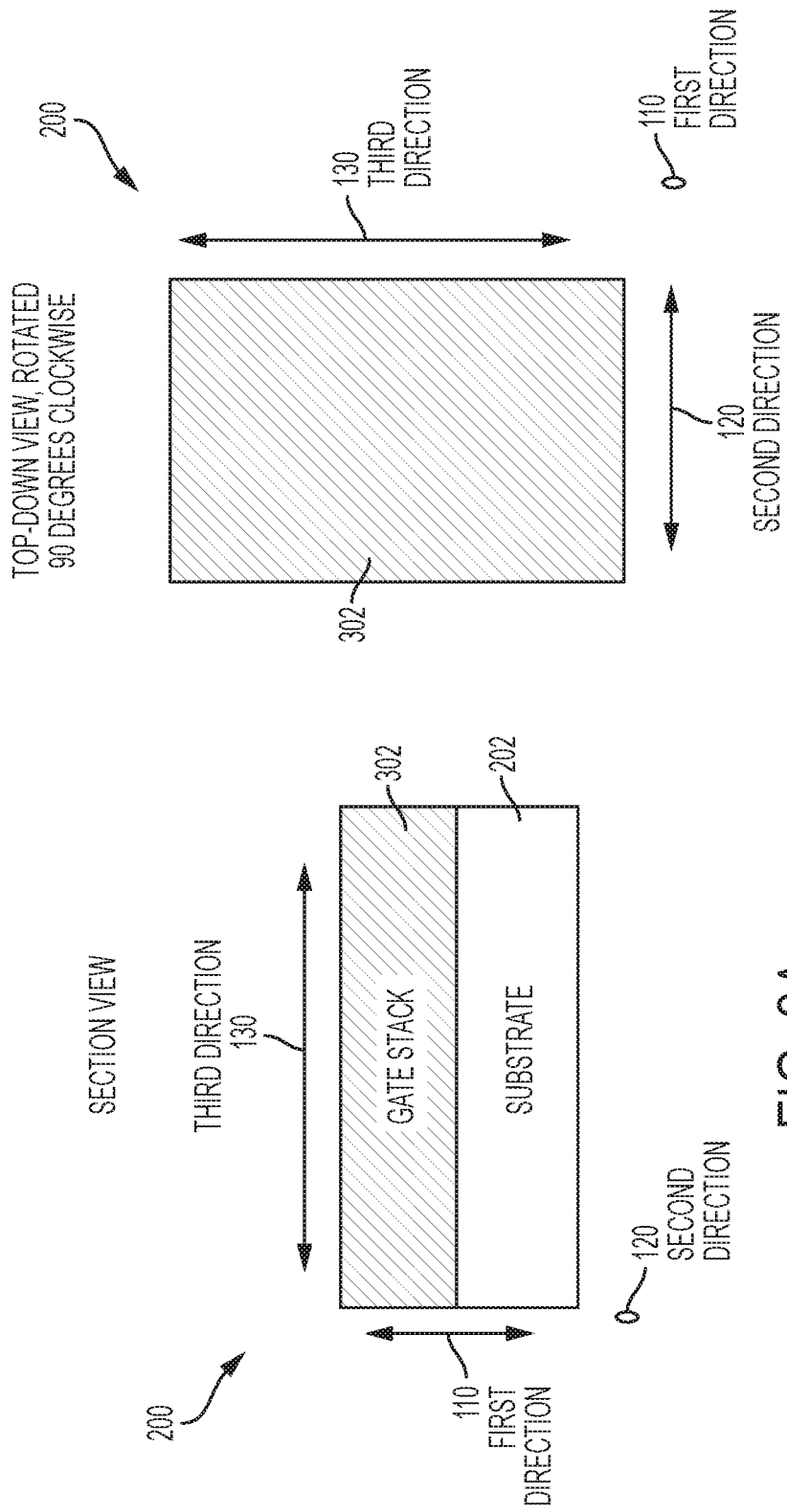

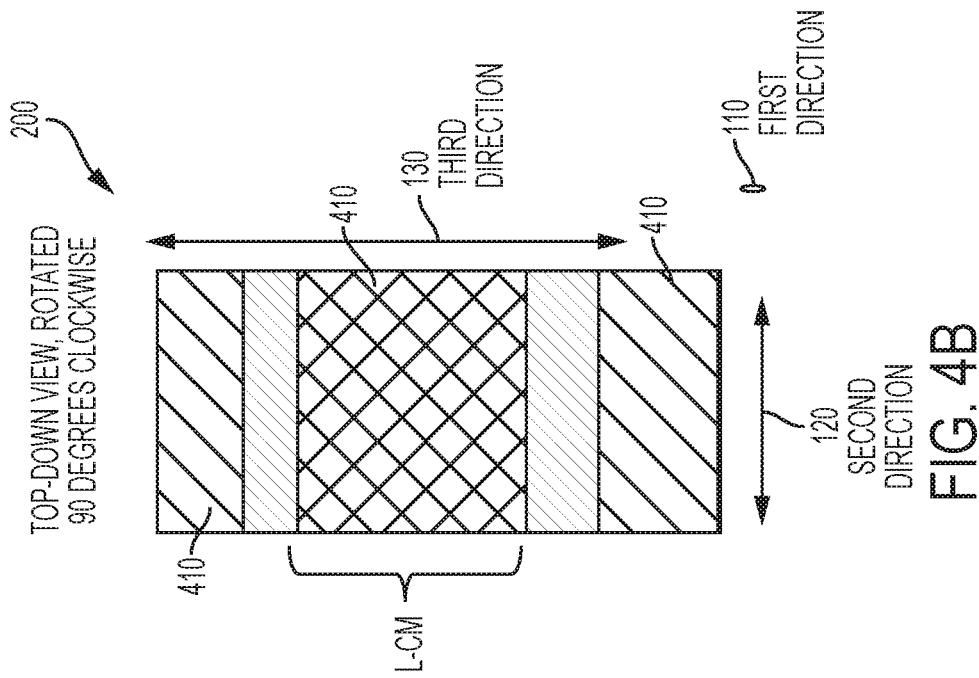
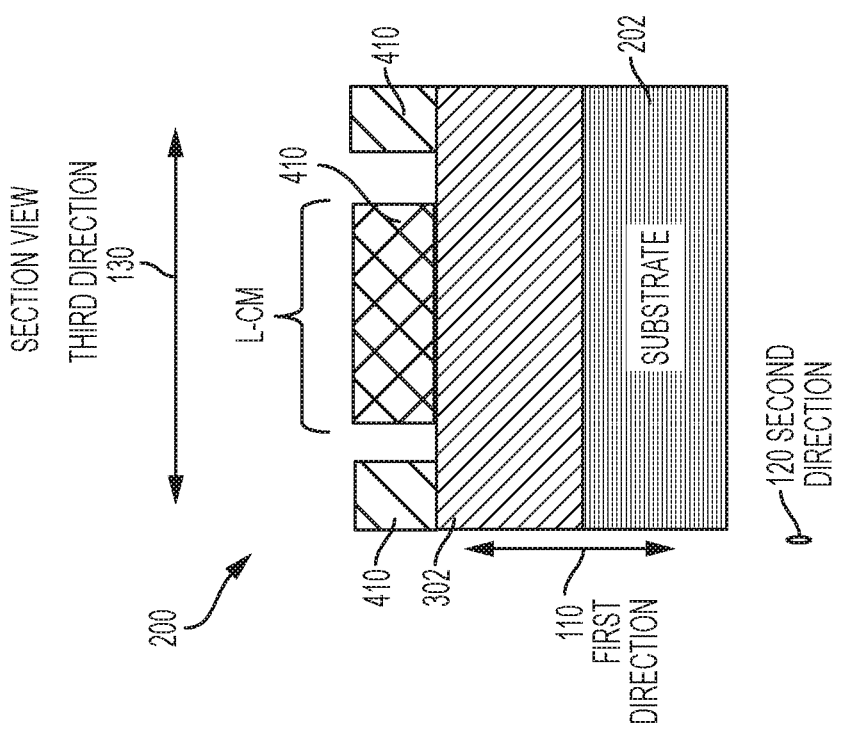

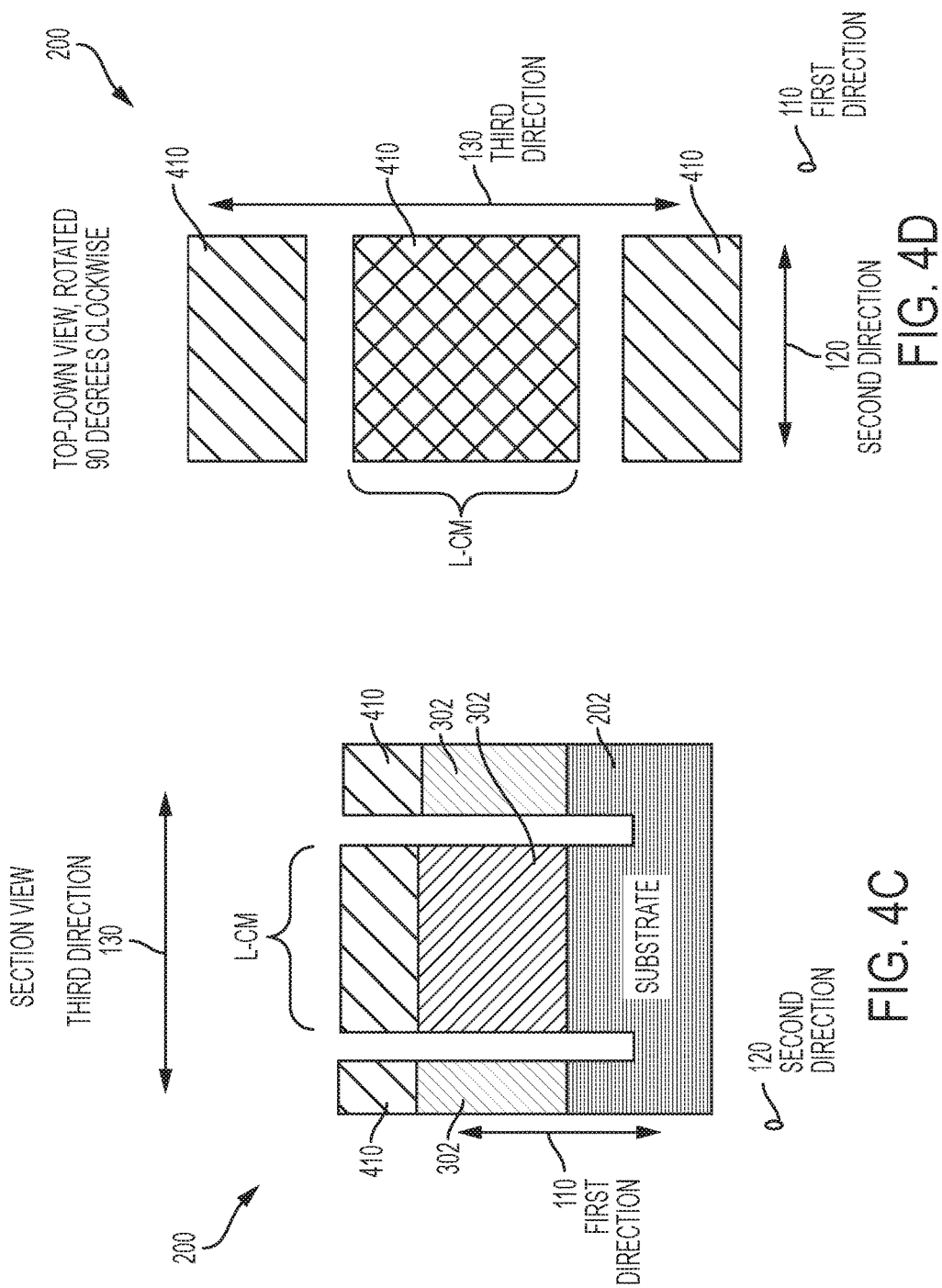

HIGH ASPECT RATIO GATES

DOMESTIC PRIORITY

This application is a divisional of U.S. application Ser. No. 15/196,299, titled "HIGH ASPECT RATIO GATES" filed Jun. 29, 2016, the contents of which are incorporated by reference herein in its entirety.

BACKGROUND

The present invention relates in general to forming semiconductor devices for use in integrated circuits (ICs). More specifically, the present invention relates to improved fabrication methodologies and resulting structures for semiconductor devices (e.g., vertical field effect transistors (FETs)) that include relatively high aspect ratio gate structures.

Semiconductor devices are typically formed using active regions of a wafer. The active regions are defined by isolation regions used to separate and electrically isolate adjacent semiconductor devices. For example, in an IC having a plurality of metal oxide semiconductor field effect transistors (MOSFETs), each MOSFET has a source and a drain that are formed in an active region of a semiconductor layer by implanting n-type or p-type impurities in the layer of semiconductor material.

One type of MOSFET is a non-planar FET known generally as a vertical FET. In order to decrease gate pitch (i.e., the center-to-center distance between adjacent gate features/structures) and increase device density on the wafer, the aspect ratios of the channel region and the gate region of a typical vertical FET device are high. In other words, the channel and gate regions are each much taller than they are wide.

SUMMARY

Embodiments of the present invention are directed to a method of forming a feature of a semiconductor device. In one or more embodiments, the feature is a gate, and the method includes forming a substrate and forming a gate material extending over a major surface of the substrate. The method further includes forming a trench extending through the gate material and into the substrate in a first direction, wherein the trench further extends through the gate material and the substrate in a second direction. The method further includes filling the trench with a fill material and forming individual gates from the gate material, wherein the individual gates extend along a third direction.

Embodiments are further directed to a method of forming a feature of a semiconductor device. In one or more embodiments, the feature is a gate, and the method includes forming a substrate and forming a gate material extending over a major surface of the substrate. The method further includes forming a first trench extending through the gate material and into the substrate in a first direction, wherein the first trench further extends through the gate material and the substrate in a second direction. The method further includes forming a second trench extending through the gate material and into the substrate in the first direction, wherein the second trench further extends through the gate material and the substrate in the second direction. The method further includes filling the first trench with a fill material. The method further includes filling the second trench with the fill material. The method further includes forming individual gates from the gate material, wherein the individual gates extend along a third direction.

Embodiments are further directed to a semiconductor structure. The semiconductor device structure includes a first trench extending into a substrate in a first direction and a second direction. The structure further includes a first anchor formed in the first trench, wherein a top portion of the first anchor extends above a major surface of the substrate. The structure further includes individual features formed over the major surface of the substrate. In one or more embodiments, the individual feature is a gate, and the structure further includes the individual gates extending along a third direction, wherein each of the individual gates is physically coupled to the top portion f the first anchor.

Additional features and advantages are realized through the techniques described herein. Other embodiments and aspects are described in detail herein. For a better understanding, refer to the description and to the drawings.

BRIEF DESCRIPTION OF THE DRAWINGS

The subject matter which is regarded as the present invention is particularly pointed out and distinctly claimed in the claims at the conclusion of the specification. The foregoing and other features and advantages are apparent from the following detailed description taken in conjunction with the accompanying drawings in which:

FIG. 1A depicts a three dimensional view of a high aspect-ratio gate structure;

FIG. 1B depicts a three dimensional view of a high aspect-ratio gate structure experiencing gate bending or gate flop-over;

FIG. 2A depicts a cross-sectional view of a structure after a fabrication stage according to one or more embodiments;

FIG. 2B depicts a top-down view, rotated 90 degrees clockwise, of the structure shown in FIG. 2A;

FIG. 3A depicts a cross-sectional view of a structure after a fabrication stage according to one or more embodiments;

FIG. 3B depicts a top-down view, rotated 90 degrees clockwise, of the structure shown in FIG. 3A;

FIG. 4A depicts a cross-sectional view of a structure after a fabrication stage according to one or more embodiments;

FIG. 4B depicts a top-down view, rotated 90 degrees clockwise, of the structure shown in FIG. 4A;

FIG. 4C depicts a cross-sectional view of a structure after a fabrication stage according to one or more embodiments;

FIG. 4D depicts a top-down view, rotated 90 degrees clockwise, of the structure shown in FIG. 4C;

Figure 4F:
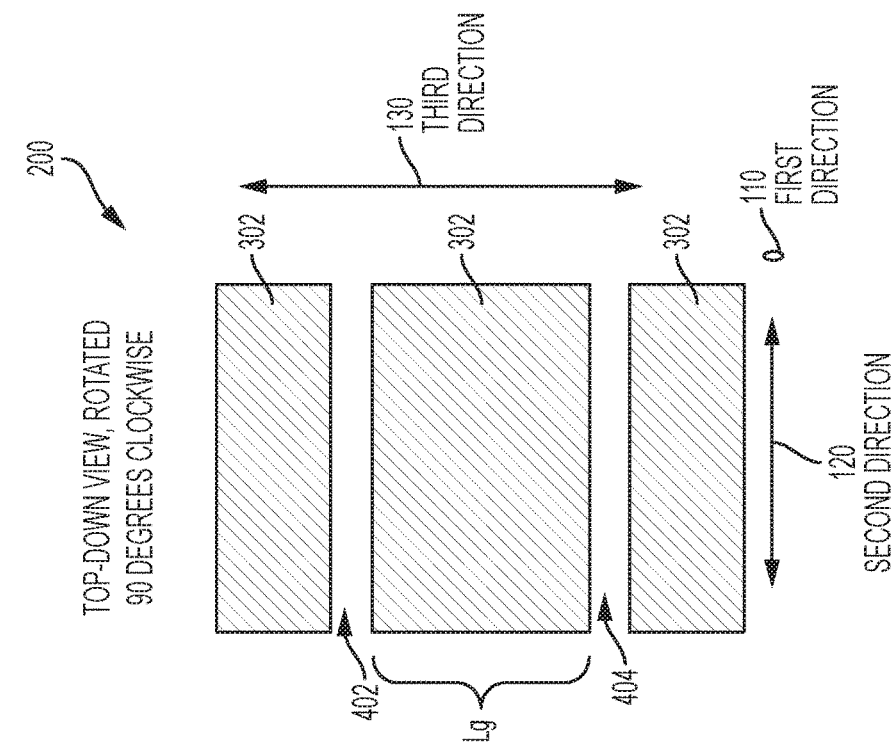
FIG. 4F depicts a top-down view, rotated 90 degrees clockwise, of the structure shown in FIG. 4E.

In the accompanying figures and following detailed description of the disclosed embodiments, the various elements illustrated in the figures are provided with three or four digit reference numbers. The leftmost digit(s) of each reference number corresponds to the figure in which its element is first illustrated.

DETAILED DESCRIPTION

It is understood in advance that, although this disclosure includes a detailed description of the formation and resulting structures for a specific type of vertical FET, implementation of the teachings recited herein are not limited to a particular type of semiconductor device or IC architecture. Rather embodiments of the present invention are capable of being implemented in conjunction with any other type semiconductor device or IC architecture, now known or later developed, as long as the semiconductor device incorporates high aspect ratio features that are susceptible to bending or flop-over during the fabrication of other features.

Various embodiments of the present invention are described herein with reference to the related drawings. Alternative embodiments may be devised without departing from the scope of this invention. It is noted that various connections and positional relationships (e.g., over, below, adjacent, etc.) are set forth between elements in the following description and in the drawings. These connections and/or positional relationships, unless specified otherwise, may be direct or indirect, and the present disclosure is not intended to be limiting in this respect. Accordingly, a coupling of entities may refer to either a direct or an indirect coupling, and a positional relationship between entities may be a direct or indirect positional relationship. As an example of an indirect positional relationship, references in the present disclosure to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" may be understood to include any integer number greater than or equal to one, i.e. one, two, three, four, etc. The terms "a plurality" may be understood to include any integer number greater than or equal to two, i.e. two, three, four, five, etc. The term "connection" may include both an indirect "connection" and a direct "connection."

Semiconductor devices are used in a variety of electronic and electro-optical applications. ICs are typically formed from various circuit configurations of semiconductor devices (e.g., transistors, capacitors, resistors, etc.) and conductive interconnect layers (known as metallization layers) formed on semiconductor wafers. Alternatively, semiconductor devices may be formed as monolithic devices, e.g., discrete devices. Semiconductor devices and conductive interconnect layers are formed on semiconductor wafers by depositing many types of thin films of material over the semiconductor wafers, patterning the thin films, doping selective regions of the semiconductor wafers, etc.

For the sake of brevity, conventional techniques related to semiconductor device and IC fabrication may not be described in detail herein. Moreover, the various tasks and process steps described herein may be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

By way of background, however, a more general description of the semiconductor device fabrication processes that may be utilized in implementing one or more embodiments of the present invention will now be provided. Although specific fabrication operations used in implementing one or more embodiments of the present invention may be individually known, the disclosed combination of operations and/or resulting structures of the present invention are unique. Thus, the unique combination of the operations according to the present invention utilize a variety of individually known physical and chemical processes performed on a semiconductor (e.g., silicon) substrate, some of which are described in the following immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Fundamental to the above-described fabrication processes is semiconductor lithography, i.e., the formation of three-dimensional relief images or patterns on the semiconductor substrate for subsequent transfer of the pattern to the substrate. In semiconductor lithography, the patterns are a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Semiconductor devices are typically formed using active regions of a wafer. The active regions are defined by isolation regions used to separate and electrically isolate adjacent semiconductor devices. For example, in an IC having a plurality of metal oxide semiconductor field effect transistors (MOSFETs), each MOSFET has a source and a drain that are formed in an active region of a semiconductor layer by implanting n-type or p-type impurities in the layer of semiconductor material. Disposed between the source and the drain is a channel (or body) region. Disposed above the body region is a gate electrode. The gate electrode and the body are spaced apart by a gate dielectric layer.

Various alternative MOSFET device structures have been proposed to improve device performance, particularly at the interface between the gate and the channel. One type of MOSFET is a non-planar device known generally as a fin-type field effect transistor (FinFET). The basic electrical layout and mode of operation of a FinFET device does not differ significantly from a traditional field effect transistor (FET). In contrast to a planar MOSFET, however, the source, drain and channel regions of a FinFET are built as a three-dimensional fin/bar on top of a local shallow trench isolation (STI) region and a semiconductor substrate. The gate electrode is wrapped over the top and sides of a middle portion of the fin such that the grate electrode is substantially perpendicular with respect to the fin. This middle portion of the fin, which is under the gate electrode, functions as the channel and provides an increased effective channel width compared to planar MOSFETs. The source and drain regions are the portions of the fin on either side of the channel that are not under the gate electrode. The source and drain regions may be suitably doped to produce the desired FET polarity, as is known in the art. The dimensions of the fin establish the effective channel length for the transistor.

As non-planar MOSFETs are scaled to smaller dimensions/geometries for higher device density, so-called vertical FETs have been developed. One type of vertical FET is known generally as a nanowire vertical FET. Unlike FinFET structures, the entire fin of a nanowire vertical FET functions as the channel region. In some configurations, the gate, which is parallel to the vertical sidewalls of the fin, wraps around the fin sidewalls. In some configurations, the source/drain regions are formed above and below the fin channel.

In order to decrease gate pitch (i.e., the center-to-center distance between adjacent gate structures) and increase device density of a typical vertical FET, it is desirable to form the fin/channel region and the surrounding gate region with relatively high aspect ratios. In other words, it is desirable for the fin/channel region and the gate region to each be much taller than wide. Additionally, tall gate structures are needed for downstream fabrication processes such as replacement gate, self-aligned contact formation, etc.

However, during the device fabrication processes that occur after the initial gate formation, tall gate structures are susceptible to a problem known as gate bend or gate flop-over, wherein the high aspect ratio gate structure bends or flops over along its height dimension. An example of gate bending/flop-over is shown in FIGS. 1A and 1B. In FIG. 1A, a high aspect ratio gate structure 100 is shown immediately after the gate formation processes have completed. At this stage of the overall device fabrication process, gate structure 100 includes a height dimension H extending along a first direction 110, a thickness dimension T extending along a second direction 120, and a length dimension L extending along a third direction 130. In general, first direction 110 is substantially perpendicular to second direction 120 and third direction 130, and second direction 120 is substantially perpendicular to third direction 130. Gate structure 100 has a high aspect ratio because, as shown, height dimension H is greater than thickness dimension T. In FIG. 1B, a high aspect ratio gate structure 100A is shown after having experienced gate bending/flop-over during one or more of the device fabrication processes that occur after the initial formation of gate 100A. Gate 100A is identical to gate 100 except a bend 140 has formed along height dimension H of gate 100A.

The present invention provides improved fabrication methodologies and resulting structures for semiconductor devices (e.g., vertical FETs) that include relatively high aspect ratio features such as the high aspect ratio gate structures 100, 100A shown in FIG. 1A and FIG. 1B. According to one or more embodiments, instead of forming the high aspect ratio gate structures from bulk gate material and then cutting the high aspect ratio gate structures to form individual high aspect ratio gate structures of a desired length, the present invention cuts the desired gate lengths from bulk gate material, attaches one or more anchors to the cut bulk gate material, and then forms the individual high aspect ratio gate structures. The anchor(s) stabilize the high aspect ratio gate structures to prevent gate bending/flop-over during subsequent semiconductor device fabrication operations. In one or more embodiments, the anchor is physically coupled to the gate structure. In one or more embodiments the anchor is physically couple d to the gate structure and an underlying substrate. In one or more embodiments, the anchor is physically coupled to one end of the gate structure. In one or more embodiments, a first anchor is physically coupled to a first end of the gate structure, and a second anchor is physically coupled to a second end of the gate structure. In one or more embodiments, one anchor is used to stabilize multiple high aspect ratio gate structures. In one or more embodiments, the gate structure is a dummy gate.

Turning now to a more detailed description of the present invention, FIGS. 2A through 6B depict cross-sectional views and top-down rotated views of a semiconductor device after various fabrication stages in accordance with one or more embodiments. FIG. 7 depicts a flow diagram illustrating a gate fabrication methodology 700 according to one or more embodiments. A description of gate fabrication methodologies according to one or more embodiment of the present invention will now be provided with reference to the gate fabrication stages shown in FIGS. 2A-6B, as well as methodology 700 shown in FIG. 7.

As shown in FIG. 2A, in an initial fabrication stage of a semiconductor structure 200 according to one or more embodiments, a substrate 202 is formed using known semiconductor fabrication techniques (block 702). FIG. 2B depicts a top-down view, rotated 90 degrees clockwise, of the semiconductor structure 200 shown in FIG. 2A. Substrate 202 includes major surfaces shown in FIG. 2A as a front (or top) surface 204 and a back (or bottom) surface 206. A variety of discrete components (not shown) (e.g., passive devices (resistors, capacitors, inductors, etc.), semiconductor device, and the like), interconnect layers and device contacts may be formed in or on substrate 202. Accordingly, substrate 202 may or may not contain existing features. In one or more embodiments substrate 202 is a semiconductor material. In one or more embodiments, substrate 202 is silicon. In one or more embodiments, substrate 202 is silicon germanium. Substrate 202 has been simplified for ease of illustration. For example, only a portion of substrate 202, as well as other structure described and illustrated herein, are shown. In practice, substrate 202 and the other features/structures (e.g., gate material 302, the number of trenches 402, 404, the number of anchors 502, 504, the number of individual gate structures 602, 604) extend further along second direction 120 and third direction 130 than shown in the figures.

As shown in FIG. 3A, in another fabrication stage of semiconductor structure 200 according to one or more embodiments, a gate material, shown as a gate stack 302, is formed over front surface 204 of substrate 202 using known deposition processes (block 704). FIG. 3B depicts a top-down view, rotated 90 degrees clockwise, of the semiconductor structure 200 shown in FIG. 3A. In one or more embodiments, the gate material is polysilicon, which may or may not be replaced by a metal depending on the gate formation process being used (e.g., gate-last, gate-first, etc.). FIG. 3B depicts a top-down view, rotated 90 degrees clockwise, of semiconductor structure 200 showing a top surface of gate stack 302.

Figure 4E:
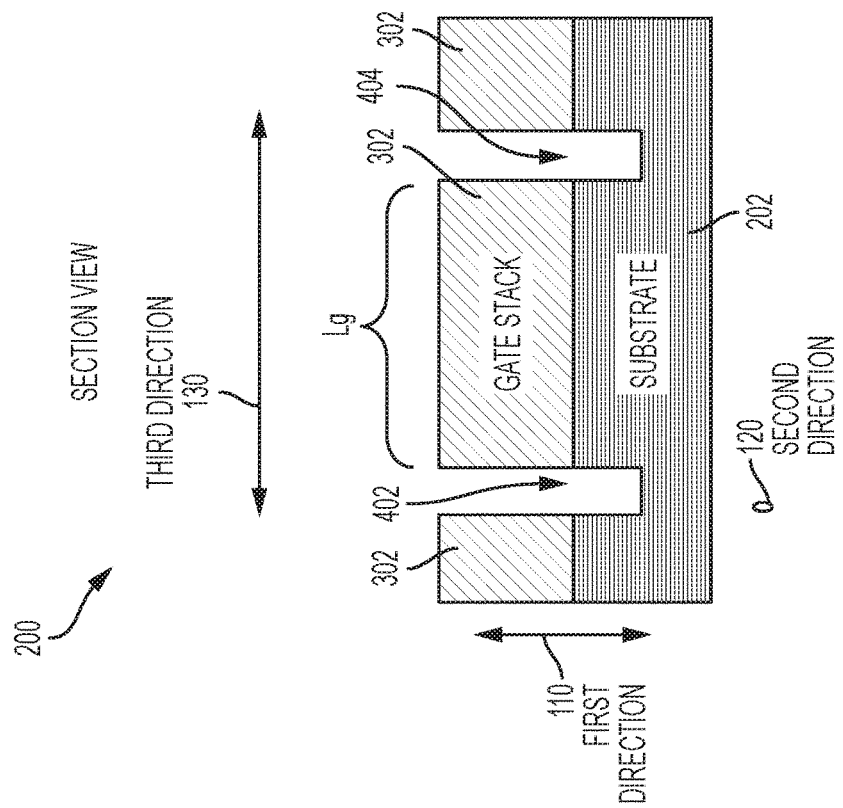
FIG. 4E depicts a cross-sectional view of a structure after a fabrication stage according to one or more embodiments.

As shown in FIGS. 4E and 4F, in another fabrication stage of semiconductor structure 200 according to one or more embodiments, a first trench 402 and a second trench 404 are formed, wherein each trench 402, 404 extends through gate stack 302 and into substrate 202 in first direction 110, and wherein each trench 402, 404 extends through gate material 302 and an upper portion of substrate 202 in second direction 120. FIG. 4F depicts a top-down view, rotated 90 degrees clockwise, of the semiconductor structure 200 shown in FIG. 4E. Trenches 402, 404 may be formed in a variety of ways, including, for example, reactive ion etching (RIE). According to one or more embodiments, instead of forming the individual high aspect ratio gate structures from bulk gate structure material, and then cutting the individual high aspect ratio gate structures to form individual high aspect ratio gate structures of a desired length, the present invention cuts/etches gat stack 302 into the desired gate lengths Lg, attaches one or more anchors 502, 502 (shown in FIGS. 5A and 5B) to the cut gate stack 302, and then forms the individual high aspect ratio gate structures 602, 604 (shown in FIGS. 6A and 6B).

FIGS. 4A, 4B, 4C and 4D depict an exemplary method and the resulting intermediate structures for cutting/etching gate stack 302 the desired gate lengths Lg by forming first and second trenches 402, 404 according to one or more embodiments of the present invention. FIG. 4B depicts a top-down view, rotated 90 degrees clockwise, of the semiconductor structure 200 shown in FIG. 4A, and FIG. 4D depicts a top-down view, rotated 90 degrees clockwise, of the semiconductor structure 200 shown in FIG. 4C. As shown in FIGS. 4A and 4B, in one or more embodiments, a cut mask 410 is placed over gate stack 302 (block 706). Cut mask 410 is shown in block diagram form for purposes of illustration, and it is understood by those skilled in the art that, in practice, cut mask 410 may take a variety of shapes and forms, depending on whether trenches 402, 404 are formed by etching or by cutting. In general, a simpler cut mask configuration may be used when trenches 402, 404 are formed by cutting, and a more elaborate cut mask may be needed when trenches 402, 404 are formed by etching in that the cut mask will need to cover the portions of gate stack 302 on either side of the trenches 402, 404 that will not need to be etched. Regardless of the in-practice cut mask configuration, cut mask 410 includes a length dimension L-CM that is used to define the gate length Lg. Accordingly, L-CM (shown in FIGS. 4A-4D) is selected to match the desired Lg (shown in FIGS. 4E-6B) for the particular semiconductor device design and/or IC design.

Figure 5B:
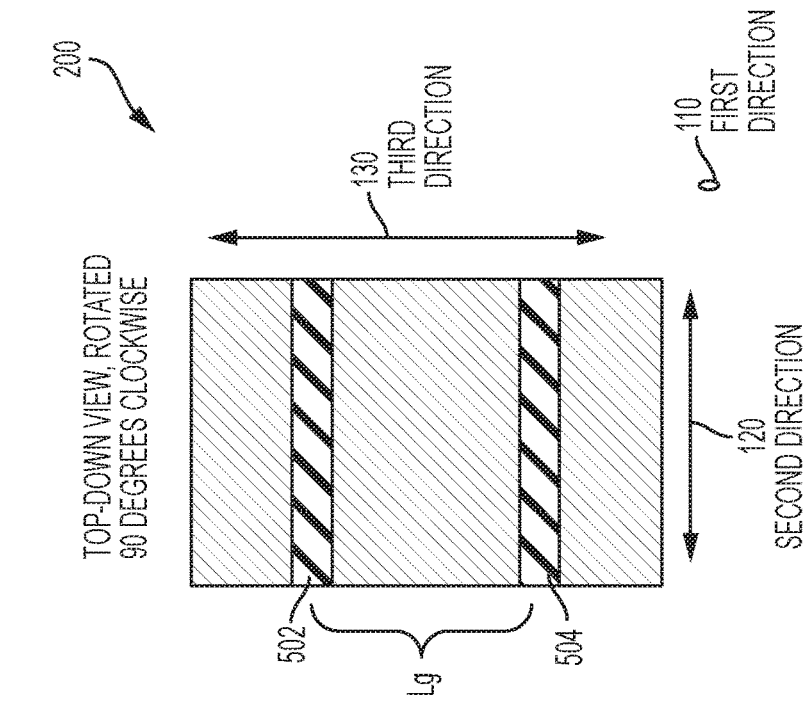
FIG. 5B depicts a top-down view, rotated 90 degrees clockwise, of the structure shown in FIG. 5A.
Figure 5A:
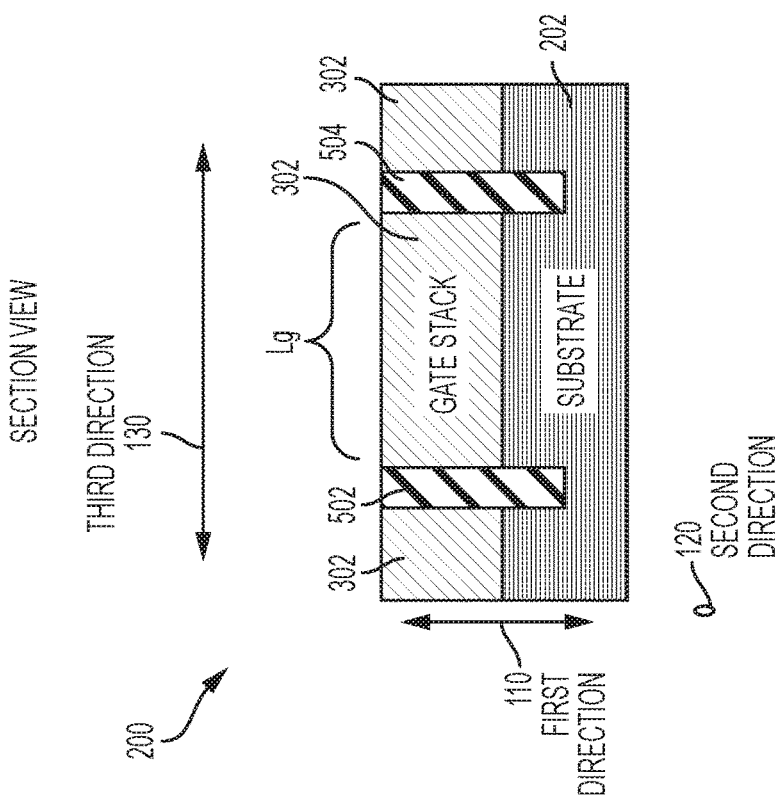
FIG. 5A depicts a cross-sectional view of a structure after a fabrication stage according to one or more embodiments.

As shown in FIGS. 5A and 5B, in another fabrication stage of semiconductor structure 200 according to one or more embodiments, a first anchor 502 and a second anchor 504 are formed in trenches 402, 404, respectively, wherein each anchor 502, 504 extends through gate stack 302 and into substrate 202 in first direction 110, and wherein each anchor 502, 504 extends through gate material 302 and an upper portion of substrate 202 in second direction 120. FIG. 5B depicts a top-down view, rotated 90 degrees clockwise, of the semiconductor structure 200 shown in FIG. 5A. In one or more embodiments, anchors 502, 504 are formed by filling (e.g., using a damascene process) trenches 402, 404 with fill material (block 708). In one or more embodiments, the fill material is nitride or silicon nitride, and anchors 502, 504 are nitride or silicon nitride blocks, which, after formation, are physically coupled to substrate 202 and gate stack 302.

Figures 6A, 6B:
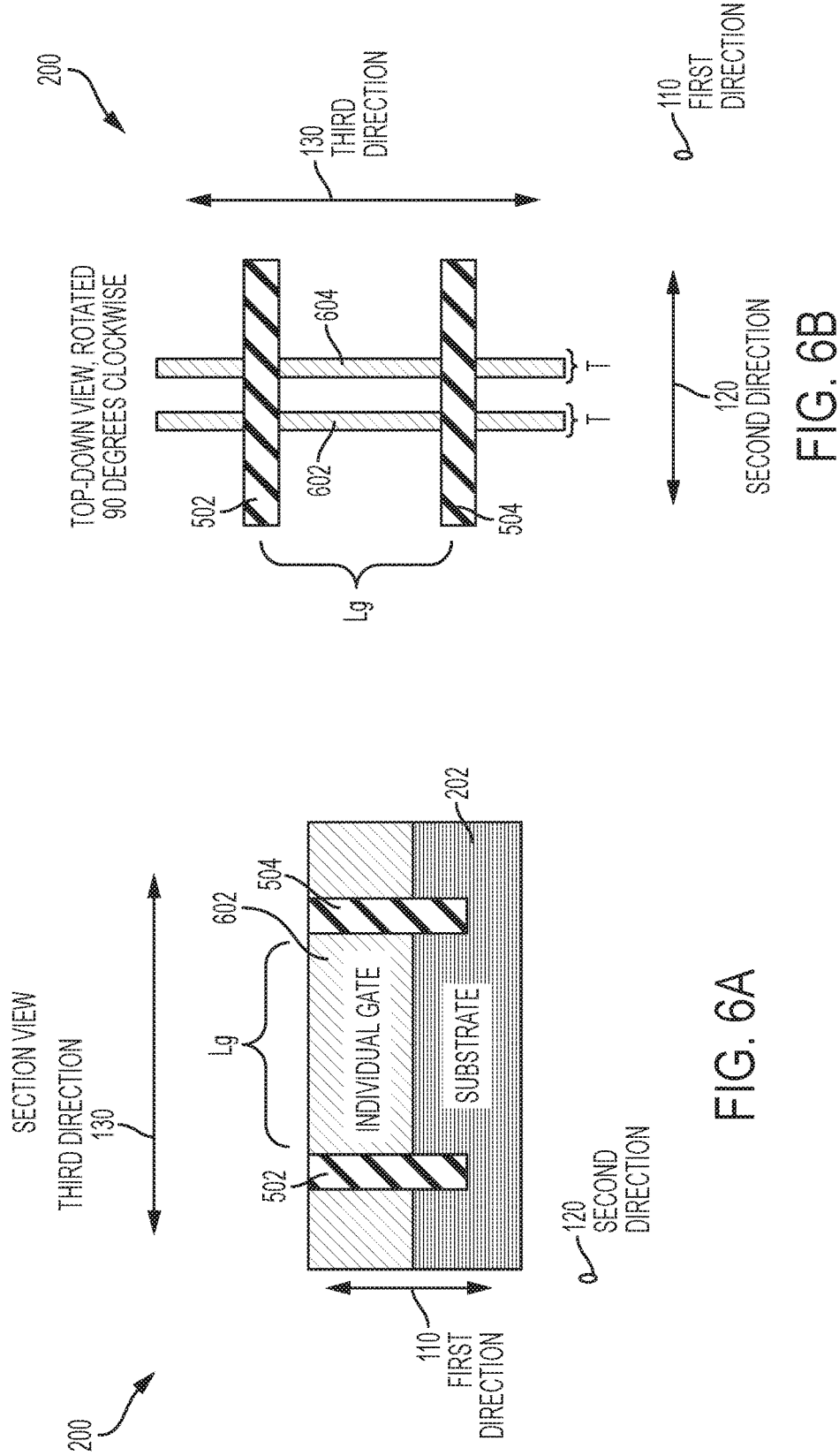
FIG. 6A depicts a cross-sectional view of a structure after a fabrication stage according to one or more embodiments.
FIG. 6B depicts a top-down view, rotated 90 degrees clockwise, of the structure shown in FIG. 6A.
Figure 7:
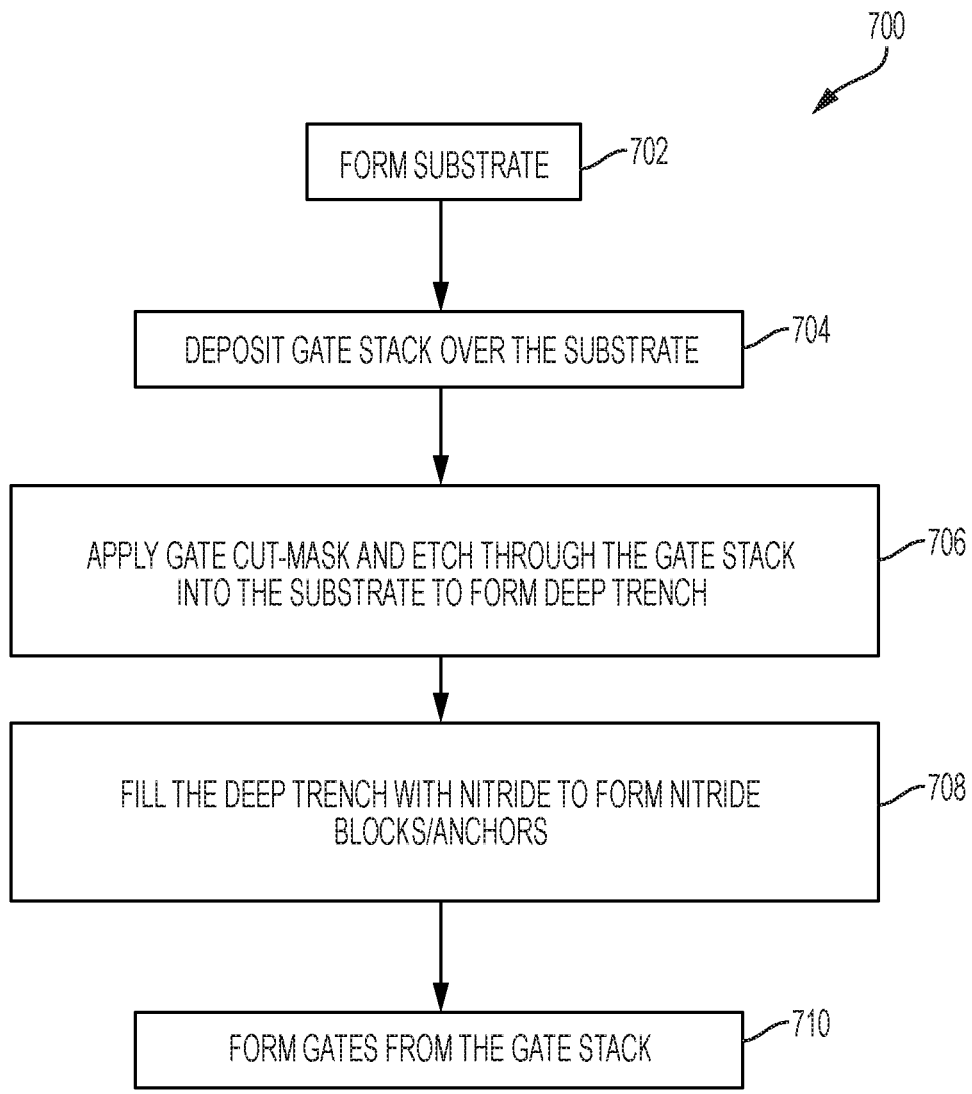
FIG. 7 depicts a flow diagram illustrating a methodology according to one or more embodiments.

As shown in FIGS. 6A and 6B, in another fabrication stage of semiconductor structure 200 according to one or more embodiments, gate stack 302 is etched or cut along third direction 130 using conventional gate formation techniques to form individual gate structures 602, 604 (block 710). FIG. 6B depicts a top-down view, rotated 90 degrees clockwise, of the semiconductor structure 200 shown in FIG. 6A. As best shown in FIG. 6b, each individual gate structure 602, 604 includes height dimension H extending along first direction 110, thickness dimension T extending along second direction 120, and length dimension Lg extending along a third direction 130. Each individual gate structure 602, 604 has a high aspect ratio because, as shown, height dimension H is greater than thickness dimension T. According to one or more embodiments, and in contrast to known gate fabrication techniques, the present invention cut/etched gat stack 302 into the desired gate lengths Lg, attached one or more anchors 502, 502 to the cut gate stack 302, and then formed individual high aspect ratio gate structures 602, 604.

After formation of individual gate structures 602, 604, semiconductor structure 200 is then processed in a conventional manner to form the desired semiconductor device (e.g., a vertical FET). In one or more embodiments, the individual gate structures 602, 604 are dummy gates, and subsequent fabrication processes (e.g., replacement gate, gate-last, etc.) are applied to remove dummy gates 602, 604 and replace them with a metal gate (not shown). Anchors 502, 504 provide support and prevent gate bending or gate flop-over of individual gate structures 602, 604 until sufficient structures (e.g., shallow trench isolation regions (STI)) are formed by downstream semiconductor device fabrication operations, which are subsequent to gate formation processes but prior to replacement gate formation processes.

Thus, it can be seen from the foregoing detailed description and accompanying illustrations that one or more embodiments of the present invention provide methodologies and resulting structures for forming high aspect ratio features of semiconductor devices. Technical effects and benefits of one or more embodiments of the present invention include, instead of forming the high aspect ratio gate structure and then cutting the high aspect ratio gate structures to form individual high aspect ratio gate structures of a desired length, embodiments of the present invention cuts the desired gate lengths from bulk gate material, attaches one or more anchors to the cut bulk gate material, and then forms the individual high aspect ratio gate structures. The anchor(s) stabilize the high aspect ratio gate structures to prevent gate bending/flop-over during subsequent semiconductor device fabrication operations. In one or more embodiments, the anchor is physically coupled to the gate structure. In one or more embodiments the anchor is physically coupled to the gate structure and an underlying substrate. In one or more embodiments, the anchor is physically coupled to one end of the gate structure. In one or more embodiments, a first anchor is physically coupled to a first end of the gate structure, and a second anchor is physically coupled to a second end of the gate structure. In one or more embodiments, one anchor is used to stabilize multiple high aspect ratio gate structures. In one or more embodiments, the gate structure is a dummy gate.

In some embodiments, various functions or acts may take place at a given location and/or in connection with the operation of one or more apparatuses or systems. In some embodiments, a portion of a given function or act may be performed at a first device or location, and the remainder of the function or act may be performed at one or more additional devices or locations.

The corresponding structures, materials, acts, and equivalents of all means or step plus function elements in the claims below are intended to include any structure, material, or act for performing the function in combination with other claimed elements as specifically claimed. The present invention has been presented for purposes of illustration and description, but is not intended to be exhaustive or limited to the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

The flowchart and block diagrams in the figures illustrate the functionality and operation of possible implementations of systems and methods according to various embodiments of the present invention. In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. The actions may be performed in a differing order or actions may be added, deleted or modified. Also, the term "coupled" describes having a signal path between two elements and does not imply a direct connection between the elements with no intervening elements/connections therebetween. All of these variations are considered a part of the disclosure.

The terms "about" or "substantially" are intended to include the degree of error associated with measurement of the particular quantity based upon the equipment available at the time of filing the application. For example, "about" can include a range of ±8% or 5%, or 2% of a given value.

The terminology used herein is for the purpose of describing particular embodiments only and is not intended to be limiting of the present invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

While the present invention has been described in detail in connection with only a limited number of embodiments, it should be readily understood that the present invention is not limited to such disclosed embodiments. Rather, the present invention can be modified to incorporate any number of variations, alterations, substitutions or equivalent arrangements not heretofore described, but which are commensurate with the spirit and scope of the present invention. Additionally, while various embodiments of the present invention have been described, it is to be understood that aspects of the present invention may include only some of the described embodiments. Accordingly, the present invention is not to be seen as limited by the foregoing description, but is only limited by the scope of the appended claims.

What is claimed is:

1. A semiconductor structure comprising:
    a first trench having at least one inner trench sidewall and extending into a substrate in a first direction and a second direction, wherein the first direction is substantially perpendicular to the second direction;
    a first anchor formed in the first trench such that a bottom portion of the first anchor extends along and physically couples to at least a portion of the at least one inner trench sidewall;
    a top portion of the first anchor extending above a major surface of the substrate; and
    individual gate structures formed over the major surface of the substrate;
    wherein the trench further extends through the substrate and gate material of the individual gate structures in a third direction;
    wherein each of the individual gate structures comprises:
    a first sidewall having a first height (H) dimension extending along the first direction and a first length (L) extending along the third direction;
    a second sidewall formed from a portion of the at least one inner trench sidewall and having a thickness (T) dimension extending along the second direction and a second H dimension extending along the first direction; and
    a third sidewall having a third H dimension extending along the first direction and a second L dimension extending along the third direction;
    wherein T is less than H;
    wherein each of the individual gate structures is physically coupled to the top portion of the first anchor.

2. The structure of claim 1 further comprising a second trench extending into the substrate in the first direction and the second direction.

3. The structure of claim 2 further comprising a second anchor formed in the second trench.

4. The structure of claim 3 further comprising a top portion of the second anchor extending above the major surface of the substrate.

5. The structure of claim 4, wherein each of the individual gate structures is physically coupled to the top portion of the second anchor.

6. The structure of claim 5, wherein a distance from the first trench to the second trench in the third direction matches a selected length dimension of each of the individual gate structures.

7. The structure of claim 6, wherein the length dimension extends along the third direction.

* * * * *